United States Patent [19]
Roschen

[11] 3,962,578
[45] June 8, 1976

[54] TWO-COLOR PHOTOELECTRIC DETECTORS HAVING AN INTEGRAL FILTER

[75] Inventor: John Roschen, Irvine, Calif.

[73] Assignee: Aeronutronic Ford Corporation, Blue Bell, Pa.

[22] Filed: Feb. 28, 1975

[21] Appl. No.: 554,193

[52] U.S. Cl. .............................. 250/226; 250/211 J; 250/211 R; 250/339; 350/316
[51] Int. Cl.² ............................................ G01J 3/50
[58] Field of Search ............ 250/339, 211 R, 211 J, 250/226, 238; 350/311, 313, 316; 357/30

[56] References Cited
UNITED STATES PATENTS

| | | |
|---|---|---|
| 3,107,302 | 10/1963 | Coleman .......................... 250/211 R |
| 3,770,958 | 11/1973 | Krakow ............................. 250/339 |

*Primary Examiner*—Eugene La Roche
*Attorney, Agent, or Firm*—Robert D. Sanborn

[57] ABSTRACT

Two photoelectric detector elements, having substantially different response wavelengths, are mounted in a housing in cascade relationship. The outer element is selected to be transparent to the response wavelength of the inner element and it is provided with an integral filter that is transmissive at the response wavelength of the inner element. Anti-reflective coatings are used to minimize reflective losses.

2 Claims, 6 Drawing Figures

TWO-COLOR PHOTOELECTRIC DETECTORS HAVING AN INTEGRAL FILTER

GOVERNMENT INTEREST

The invention described herein was made in the course of or under contracts with the Department of the Army and Department of the Navy.

BACKGROUND OF THE INVENTION

Photodetectors responsive to two or more colors have been proposed in the prior art. In some devices the individual color elements are mounted side by side and in some cases one element has a hole in it through which the second element is illuminated. Such devices in effect share the field of view and, when using a common optical system, do not both "see" the same volume of space. In other prior art designs two or more separate detectors are combined into a system that uses dichroic or some other form of beam splitting optics to illuminate the detectors from a common optical input. In still another prior art system a cascade of photodetectors is employed wherein a stack of detectors or possibly a series of photosensitive layers is arranged in a common optical system.

All of the above approaches have some drawbacks. Where separate detectors are used, complicated optics and separate device mountings must be dealt with. Where stacks of devices are used, each element tends to degrade the performance of the others and a sensitivity compromise must be struck.

SUMMARY OF THE INVENTION

It is an object of the invention to provide photodetector assemblies responsive to a plurality of colors wherein each element has a common optical input and is selectively optimized to perform as well as if it were not associated with other elements.

It is a further object of the invention to incorporate integral filtering into a cascade of different color photodetectors elements to provide an integral multicolor unitary device.

It is a feature of the invention that a plurality of different color detectors can be individually optimized and assembled into a common housing to facilitate mounting and cryogenic cooling.

These and other objects and features are achieved in a common device mounting system. In a typical two-color device the two elements are fabricated separately. The long wavelength detector is then mounted directly under the short wavelength detector. A filter designed to pass the long wavelength is located between the two elements. Anti-reflective coatings are employed to minimize reflections at all discontinuous interfaces. By such construction each detector can be optimized in terms of performance so that it operates about as well as it would alone in a spearate mounting. Since all of the elements, including filters and anti-reflective coatings, are in a unitary mount, thermal control is greatly enhanced and a unitary dewar flask can be used in the associated cooling system.

DESCRIPTION OF THE INVENTION

Figure 1:
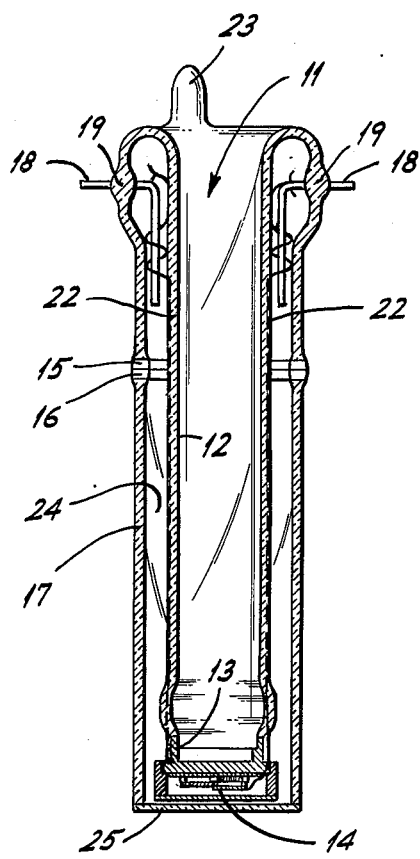
FIG. 1 shows a typical dewar flask in cross section with detector elements mounted therein.

FIG. 1 shows in cross section a typical modern infrared (IR) detector located in a dewar flask. The inner bore 11 is designed to contain a quantity of coolant such as liquid nitrogen, for operation at 77° Kelvin, or some other cryogenic refrigerant. Alternatively a suitable Joule-Thompson cryostat (not shown) could be located inside bore 11 and supplied with gas for extended periods of operation at cryogenic temperatures. The inner bore 11 is defined by a glass tube 12 which is closed at its lower end by means of a metal cup 13 that is hermetically sealed to tube 12. The active IR detector elements 14 are located on the outer face of cup 13. The upper end of tube 12 flares outwardly and is folded back around the outside of tube 12 to a metal ring 15 which is hermetically sealed to the folded back portion. In final assembly ring 15 is joined vacuum tight to ring 16 which is hermetically sealed to glass envelope 17 which completely covers tube 12 and cup 13. Envelope 17 is ordinarily made of glass and includes IR transparent window 25 sealed across the end. Window 25 is made of a material such as silicon, germanium, sapphire, barium fluoride, or Irtran II (which is a form of hot pressed zinc sulfide available from Eastman Kodak Co). In practice the active elements 14 are assembled onto cup 13 and tested if desired. Then the assembly, which includes envelope 17 with ring 16 sealed thereto, is completed by joining rings 15 and 16 together.

Lead-in connections 18 are incorporated into the device in suitable numbers by glass to metal seals 19 and these are located in a radial array around the folded back envelope portion. Lead wires 22 can be attached to the lead in connections 18 and run along the outside of tube 12 to make connection to the active elements 14. Alternatively lead wires 22 can take the form of conductive painted or deposited stripes along the outside of tube 12.

Tip off tubulation 23 is a conventional vacuum tip off provided so that the space 24 between tube 12 and the outer portion of the envelope can be evacuated. This vacuum eliminates frosting of the window and provides thermal insulation to reduce dewar flask heat loss. The vacuum portion 24 may be provided with a getter (not shown) of the type used in vacuum tube manufacture to enhance the vacuum characteristics. If desired conventional outgassing techniques can be employed in the vacuum processing.

Figure 2:
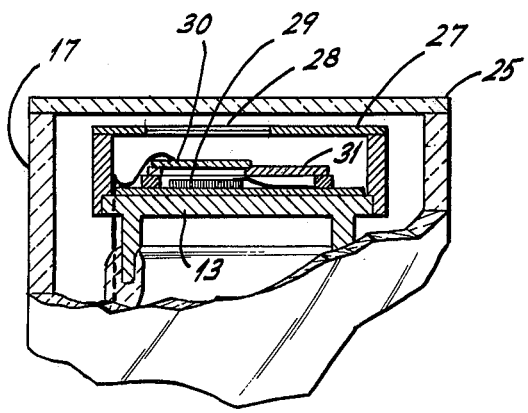
FIG. 2 shows the details of active device mounting in the dewar flask of FIG. 1.

FIG. 2 shows the arrangement of elements at the end of tube 12 of FIG. 1. Cup 13 has attached thereto cold shield 27 which has an aperture 28 located in relation to the detector elements to control the field of view of the detector. This aperture is made smaller if a narrower field of view is desired. By having shield 27 surround the active detector elements the elements "see" an ambient at the cryogenic temperature. Therefore only radiation entering aperture 28 through window 25 will act upon the elements.

In accordance with the invention active element 29 is a long wavelength sensitive device such as an indium antimonide P-N junction chip. Element 30 is a short wavelength device such a germanium or silicon planar P-N junction chip with an associated long-wavelength pass filter on the lower side thereof. Element 30 is located on mounting plate 31. Long wavelength radiant energy entering aperture 28 will pass through element 30 and its associated filter and impinge upon element 29 whereupon it will be detected. Short wavelength energy entering aperture 28 will be substantially absorbed and detected by element 30.

Figure 3:
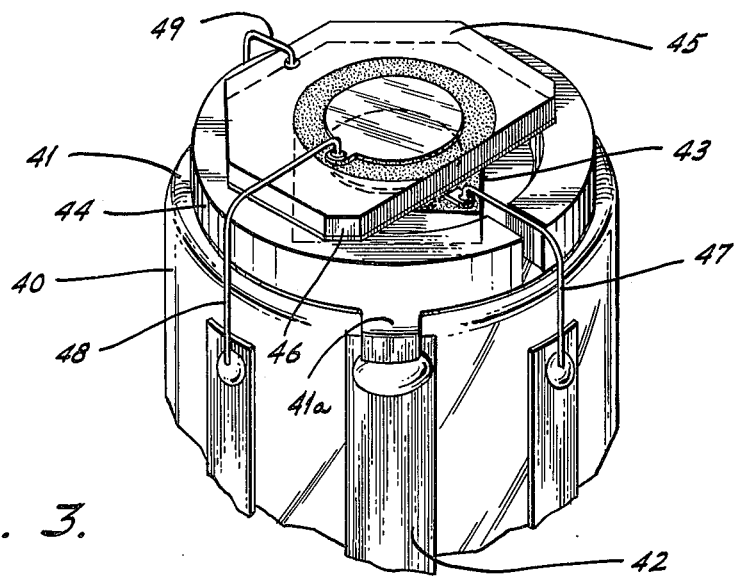
FIG. 3 shows an alternative form of device mounting incorporating two detector elements and an integrated filter.
Figure 3A:
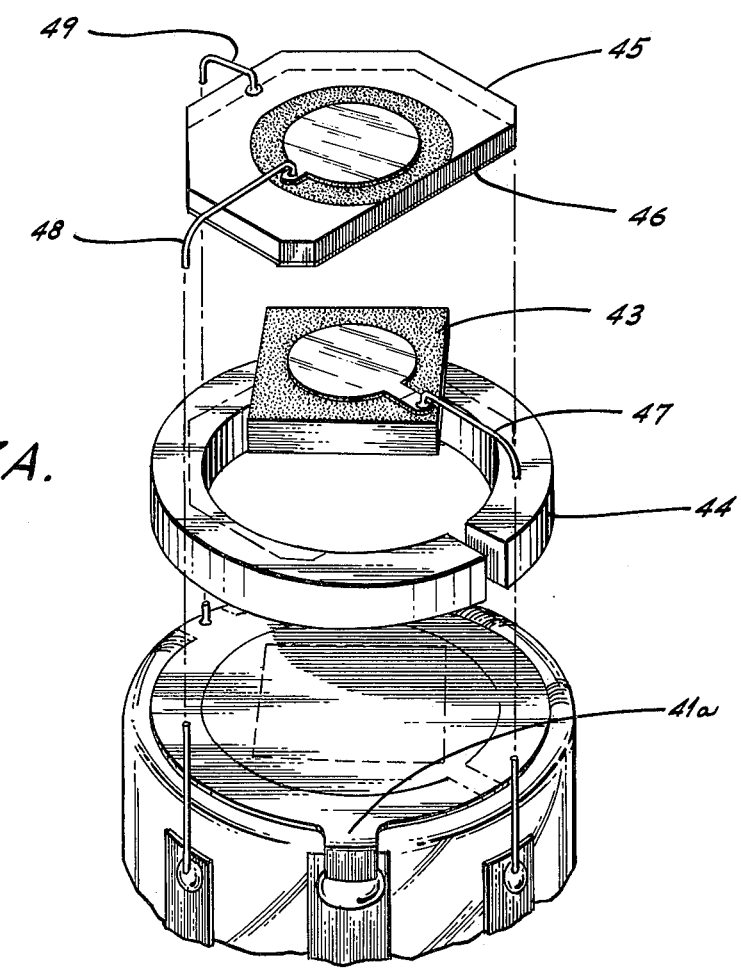
FIG. 3A is an exploded view of FIG. 3.

FIG. 3 shows the details of a particular form of detector assembly used to practice the invention. FIG. 3A is an exploded view of FIG. 3 designed to show the construction details. Shown is the exterior of the end of the inner portion of a dewar flask. A glass tube 40 is closed with a glass or sapphire disk 41 that is provided with surface metallization 41a. Not shown is the cold shield and the remainder of the dewar flask which elements are conventional. Metal layer 41a has a tab that is soldered to metal strip 42 which acts as a lead in conductor. Long wavelength detector element 43 is soldered to metal layer 41a which provides one contact thereto. Insulating spacer 44, which may have metallized upper and lower faces if desired, is secured to metallization 41a so as to surround element 43 and is made slightly thicker than element 43. Lead wire 47 completes the electrical connection to the upper contact on element 43 and is dressed through a gap in insulator 44.

Short wavelength detector element 45 is made large enough to mount on ring 44 and is secured to the upper face of ring 44 directly over element 43. Before mounting, element 45 is coated with a layer of material 46 that acts as a long wavelength bandpass filter. The passband of the filter is selected as desired for a particular application so as to be within the response of element 43. Layer 46 also acts as an anti-reflective coating to reduce interface reflective loss. Lead wires 48 and 49 complete the connections to element 45. The detector assembly of FIG. 3 can, if desired, be provided with a cold shield (not shown) and mounted conventionally in a complete dewar flask.

Figure 4:
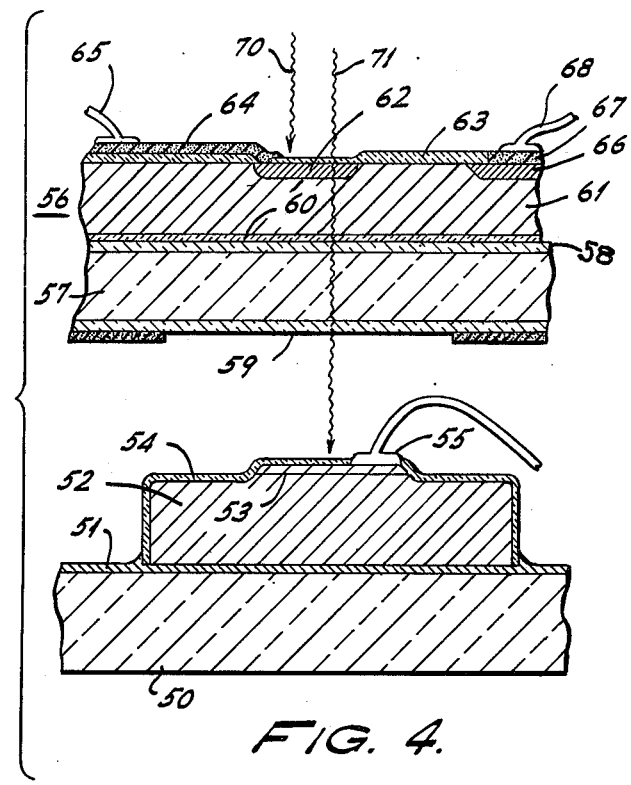
FIG. 4 shows the structual details of a two-color detector using silicon and indium antimonide active elements with an integrated filter of conventional design.

FIG. 4 shows in cross section the essential details of still another form of active element assembly. Sapphire substrate 50 comprises the end closure for the inner portion of a dewar flask (not shown), or alternatively is mounted to the end closure and therefore constitutes a cryogenic surface. It also acts as a printed wiring substrate for the overlying electrical elements. Sapphire is used because of its high thermal conductivity, electrical insulating qualities, and glass-sealing compatibility. The surface of the sapphire 50 is provided with printed wiring metallization 51. N-type indium antimonide element 52 is soldered to a portion of wiring 51. Element 52 has a mesa defined P-type layer 53, and is completely covered with a passivating layer of $SiO_2$ or alternatively a layer of indium oxide 54 except where ohmic contact 55 connects to layer 53. The layer is controlled in thickness to provide an anti-reflective coating for maximizing detector response. Element 52 in the form shown has a peak IR response at about 4.7 microns.

Spaced above element 52 is a long wavelength transmissive short wavelength detector and filter combination 56. A conventional commercially available two-sided filter is fabricated from a section of sapphire 57 and made of a material and a thickness such that IR radiant energy at about 4.7 microns is passed. An anti-reflective coating 60 is added so that in its pass band the filter is highly transmissive. Chip 61 is of N-type silicon and contains a planar photodiode created by diffused P-type region 62. The P-type region doping is kept as low as possible to minimize optical losses but is kept high enough to produce a good PN junction. The upper chip surface is covered by the typical passivating layer of silicon dioxide 63. This layer is controlled in thickness to act as an anti-reflective coating. Aluminum metallization 64 makes an ohmic contact to P-type region 62 and a wire bond 65 provides a connecting lead. Aluminum metallization 67 makes an ohmic contact to diffused N+ type region 66 and connecting lead 68 completes connection to the chip body. Element 56 is mounted directly over element 52 so that the active diode regions are in alignment (by means not shown). Short wavelength radiation in the vicinity of visible to near infra-red or about 0.9 micron, as indicated by arrow 70, is absorbed in device 56 and activates the silicon photodetector. Long wavelength radiation at about 4.7 microns, as denoted by arrow 71, passes through device 56 and actuates device 52.

Figure 5:
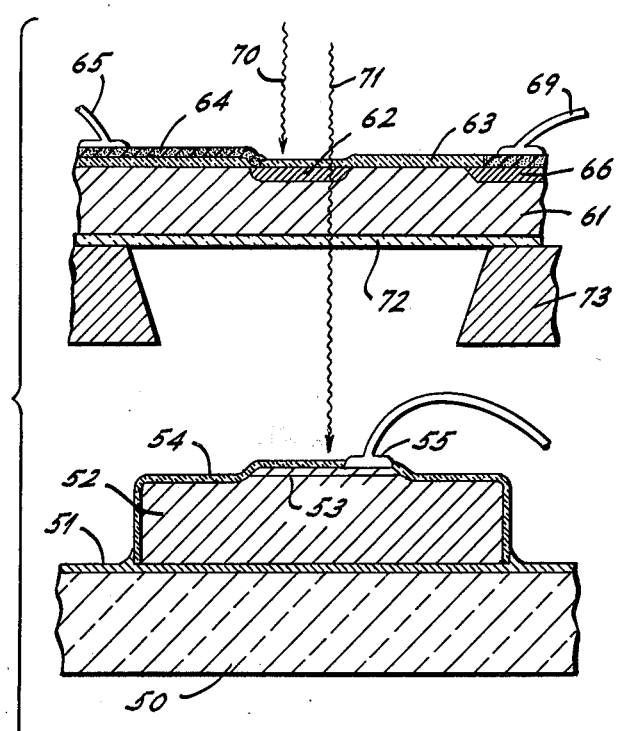
FIG. 5 shows an alternative design for the FIG. 4 device.

FIG. 5 shows an alternative embodiment of FIG. 4. The long wavelength detector is the same as that of FIG. 4 as is the active silicon planar P-N junction detector 61. However in this case the planar device 61 is provided with an integral filter coating 72 which comprises a series of vacuum deposited dielectric layers having thicknesses and refractive indices selected for the desired pass band. This layer too is designed to act as an anti-reflective coating. Since filter coatings, and the construction thereof are well known in the prior art, they will not be detailed further here. Suffice it to say that filter 72 is selected to complement the photoresponse of device 52. The integral-filter-containing chip 61 is mounted on a Kovar mounting plate 73 for incorporation into a dewar flask assembly.

It will be noted that all of the interfaces where the radiant energy passes between media of different refractive indices an anti-reflective coating in present. Layers 54 and 72 are optimized for the long wavelength response of device 52. Layer 63 is adjusted in thickness to act as an anti-reflective coating for both wavelengths. It is made thick enough to be anti-reflective at the long wavelength so that at the short wavelength harmonics it also will be anti-reflective. Thus a single coating can be used to optimize the response of both detectors.

EXAMPLE 1

A two color detector was fabricated in accordance with the showing of FIG. 3 and operated at 77° Kelvin. A germanium short wave length device had a peak response at 1.4 microns, and an indium antimonide device provided response peaking at 4.4 microns.

The filter bandpass was 4.0 to 4.8 microns. The germanium detector had a peak responsivity of 0.65 amperes per watt for a background of 300°K and a 120° field of view. The associated indium antimonide detector had a peak detectivity $D^*(4.4\mu, 1000 Hz., 1 Hz.)$ of $1.8 \times 10^{11}$ cm $Hz^{1/2}w^{-1}$.

EXAMPLE 2

Two color detector arrays were constructed as shown in FIGS. 4 and 5 and operated at 77° Kelvin.

In both cases the filter bandpass was 4.0 to 4.8 microns. The silicon device had a peak response of 0.9 micron. In both structures the silicon detector responsivity was between 0.29 and 0.37 amperes per watt at a background of 300°K with a field of view of 35°. In the structure of FIG. 4 the indium antimonide detector sensitivity D* (4.4$\mu$,1000Hz, 1Hz) was 1.5–1.8 × 10$^{11}$ cm Hz$^{\frac{1}{2}}$w$^{-1}$.

From the above examples it can be seen that the performance of the detectors integrated into a two color device in accordance with the invention is excellent.

The foregoing has shown and described an arrangement for producing two color photodetectors wherein the excellent performance of separate devices is retained in the combination and examples of performance are given. Clearly a person skilled in the art will recognize alternatives and equivalents. For example while the specification shown silicon or germanium short wavelength detectors in combination with indium antimonide long wavelength detectors, other combinations could be employed. Examples of other suitable long wavelength detectors include photovoltaic indium arsenide at 3.5$\mu$, photo conductive lead sulphide and lead selenide at about 3 and 5$\mu$; photovoltaic lead telluride or lead selenide at 5$\mu$, photoconductive mercury-cadmium telluride at 8–14$\mu$, photovoltaic lead-tin-telluride (or selenide) at 8–12$\mu$, and extrinsic doped germanium or silicon in the range of 2–30$\mu$. It is only necessary that the short wavelength detector be transparent to the long wavelength being detected. Also while a particular kind of dewar flask has been shown, other designs could be used including double dewar flasks intended for liquid hydrogen or helium use. Furthermore the concept is useful in higher temperature devices such as those employing thermoelectric cooling or even room temperature devices employing no actual cooling. Finally, while single element devices are shown, photoelectric arrays, both one and two dimensional, could be employed. Accordingly, it is intended that my invention be limited only by the following claims.

I claim:

1. In a photodetector combination constructed to sense radiant energy in a plurality of wavelength bands, said combination comprising:

a first photodetector optimized for response at a first wavelength, said first photodetector constructed to be transparent to a second wavelength that is relatively longer than said first wavelength and with active elements adjacent a first face thereof, a second photodetector optimized for response of said second wavelength, and means for mounting said first and said second photodetectors in a cascade wherein illumination is directed onto said first face of said first photodetector, the improvement comprising an integral filter coating formed on a second face of said first photodetector, said second face being opposite said first face and adjacent said second photodetector, said filter coating forming a bandpass radiant energy filter intermediate said first and said second photodetectors, said bandpass being selected to fall within the radiant energy wavelength response of said second photodetector.

2. The improvement of claim 1 wherein said filter coating is controlled in thickness to act as an anti-reflective coating at said second wavelength.

* * * * *